(12) United States Patent
Gallhauser et al.

(10) Patent No.: US 10,591,535 B2
(45) Date of Patent: Mar. 17, 2020

(54) MEASURING SYSTEM WITH ANTENNA ALIGNMENT

(71) Applicant: Rohde & Schwarz GmbH & Co. KG, Munich (DE)

(72) Inventors: Markus Gallhauser, Freising (DE); Thomas Hartmann, Hawangen (DE); Nino Voss, München (DE); Werner Perndl, Zorneding (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 126 days.

(21) Appl. No.: 15/948,599

(22) Filed: Apr. 9, 2018

(65) Prior Publication Data

US 2019/0310313 A1 Oct. 10, 2019

(51) Int. Cl.
*H04B 17/00* (2015.01)
*G01R 31/302* (2006.01)
*G01R 31/317* (2006.01)

(52) U.S. Cl.
CPC ... *G01R 31/3025* (2013.01); *G01R 31/31701* (2013.01); *H04B 17/00* (2013.01)

(58) Field of Classification Search
CPC ............... H04B 17/00; G01R 31/3025; G01R 31/31701
See application file for complete search history.

(56) References Cited

U.S. PATENT DOCUMENTS

| | | | |
|---|---|---|---|
| 2002/0095304 A1* | 7/2002 | Khazei | G01R 31/002 702/127 |
| 2002/0177405 A1 | 11/2002 | Chedester et al. | |
| 2018/0031606 A1* | 2/2018 | Isaac | G01R 1/045 |
| 2018/0080967 A1* | 3/2018 | Lee | G01R 29/10 |

FOREIGN PATENT DOCUMENTS

| | | |
|---|---|---|
| KR | 1020020020529 A | 3/2002 |
| WO | 2008058785 A1 | 5/2008 |
| WO | 2017040400 A1 | 3/2017 |

\* cited by examiner

*Primary Examiner* — Tuan Pham
(74) *Attorney, Agent, or Firm* — Ditthavong & Steiner, P.C.

(57) ABSTRACT

A measuring system for performing over-the-air measurements on a device under test is provided. The measuring system comprises an antenna, configured for performing over-the-air measurements, an alignment device and an antenna holder interface, configured for interchangeably holding one of the antenna and the alignment device. The alignment device is configured for aligning the antenna holder interface and the device under test.

14 Claims, 3 Drawing Sheets

MEASURING SYSTEM WITH ANTENNA ALIGNMENT

TECHNICAL FIELD

The invention relates to aligning different components of a measuring system and performing over-the-air measurements in this measuring system.

BACKGROUND ART

With increasing integration of mobile communications devices, performing measurements through high-frequency cable connections often is no longer possible. Therefore, the need for over-the-air measurement systems is constantly rising. In such systems, an alignment of the different system components is of great importance to achieve accurate measuring results.

The document U.S. Pat. No. 6,611,696 B2 discloses an apparatus and method for aligning the antennas of two transceivers of a point-to-point wireless millimeter wave communications link. There, alignment lasers are directly attached to the antennas for performing the alignment of the antennas. This makes it necessary though to perform a re-alignment, each time the antenna is replaced.

Especially in measuring systems, in which a single device under test may be measured using a number of different antennas, this leads to a high overhead for each individual measurement.

Accordingly, there is a need to provide a measuring system and method, which allow for a quick alignment of the components without requiring complex hardware.

SUMMARY OF THE INVENTION

According to a first aspect of the invention, a measuring system for performing over-the-air measurements on a device under test is provided. The measuring system comprises an antenna, configured for performing over-the-air measurements, an alignment device and an antenna holder interface, configured for interchangeably holding one of the antenna and the alignment device. The alignment device is configured for aligning the antenna holder interface and the device under test. This allows for aligning the antenna holder interface to the device under test, thereby enabling performing a measurement using an antenna, which can be connected to the antenna holder interface without performing an additional alignment of the antenna.

Advantageously and preferably, the alignment device is a laser, configured for emitting a laser beam. This allows for a high-range alignment.

Further advantageously and preferably, the antenna holder interface is configured so that a main radiation direction of the antenna is fixed to a first direction relative to the antenna holder interface, when the antenna holder interface holds the antenna. The antenna holder interface is moreover configured to hold the alignment device so that the laser beam is emitted into said first direction.

This allows for an alignment of the antenna while the antenna is not connected.

Advantageously and preferably, the antenna comprises an interface configured to connect to the antenna holder interface. Additionally or alternatively, the alignment device comprises an interface configured to connect to the antenna holder interface. This allows for a very simple construction of the different components of the measuring system.

Advantageously and preferably, the antenna holder interface is aligned with the device under test when the first direction points to a specific point of the device under test. This allows for a very simple alignment.

Preferably, the system additionally comprises the device under test. The device under test then comprises an interface, configured for holding the alignment device. This allows an alignment in the opposite direction.

Advantageously and preferably, the interface of the device under test is configured for holding the alignment device, so that the alignment device emits the laser beam into a second direction fixed with regard to the device under test, when the alignment device is held by the interface of the device under test. This allows for a very accurate alignment of the device under test with regard to the antenna holder interface.

Preferably, the device under test is aligned with the antenna holder interface, when the second direction points to a specific point of the antenna holder interface. This allows a very accurate alignment.

According to a second aspect of the invention, a method for performing measurements on a device under test is provided. The method comprises connecting an alignment device to an antenna holder interface, aligning said alignment device with the device under test, connecting an antenna to the antenna holder interface while keeping the orientation and position of the antenna holder interface fixed and performing measurements on the device under test, using the antenna. It is thereby possible to perform very accurate measurements.

Advantageously and preferably, the alignment device emits a laser beam. This allows for a very high-range alignment.

Preferably, a main radiation direction of the antenna is fixed to a first direction relative to the antenna holder interface, when the antenna holder interface holds the antenna. The antenna holder interface holds the alignment device so that the laser beam is emitted into said first direction. This allows for a very accurate alignment.

Advantageously and preferably, the antenna holder interface is aligned with the device under test, when the first direction points to a specific point of the device under test. This allows for a further increase in alignment accuracy.

Preferably, an interface of the device under test can hold the alignment device so that the alignment device emits the laser beam into a second direction fixed with regard to the device under test, when the alignment device is held by the interface of the device under test. This allows for an alignment in the opposite direction.

Advantageously and preferably, the device under test is aligned with the antenna holder interface, when the second direction points to a specific point of the antenna holder interface. This allows for an especially accurate alignment.

BRIEF DESCRIPTION OF THE DRAWINGS

Exemplary embodiments of the invention are now further explained by way of example only with respect to the drawings, in which.

DETAILED DESCRIPTION OF THE PREFERRED EMBODIMENTS

Figure 1:
FIG. 1 shows an exemplary measuring system.

First, we demonstrate the problems of an exemplary measuring system along FIG. 1. With regard to FIG. 2-FIG. 4, we then demonstrate the construction, function and benefits of different embodiments of the measuring system of the first aspect of the invention. Finally, along FIG. 5, the detailed function of an embodiment of the measuring method according to the second aspect of the invention is shown. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

In FIG. 1, an exemplary measuring system comprising an antenna 1 is shown. Obviously, also a measuring is necessary. This is though not displayed, since it is not important for the invention. A main radiation direction of the antenna 1 is depicted as a dashed line. When performing over-the-air measurements on a device under test 2, especially when performing these measurements under far-field conditions, a significant distance between the antenna 1 and the device under test 2 is usually employed. As depicted here, it is not always easy to perfectly align the measuring antenna 1 and the device under test 2. Especially when performing tests on direction sensitive devices under test, for example when performing MIMO measurements, a perfect alignment is of great importance for achieving accurate measuring results.

First Embodiment

Figure 2:
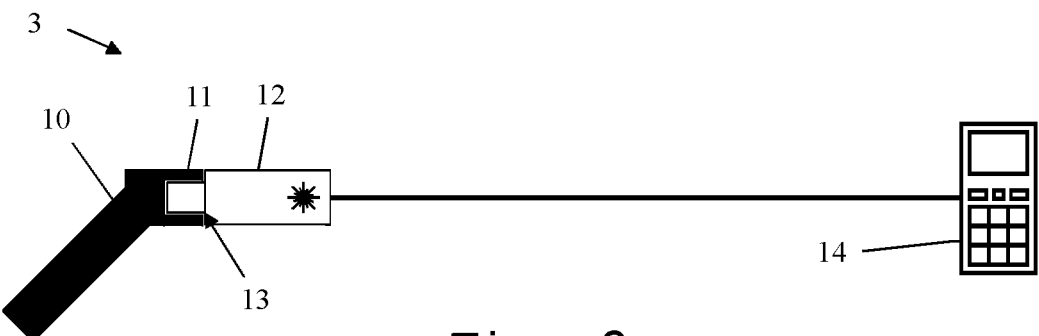
FIG. 2 shows a first embodiment of a measuring system according to the first aspect of the invention.

In FIG. 2, a first embodiment of a measuring system 3 according to the first aspect of the invention is shown. Here, the measuring system 3 comprises an antenna holder 10, which comprises an antenna holder interface 11. Connected to the antenna holder interface 11 is an interface 13 of an alignment device 12. The alignment device 12 here is a laser, especially a semiconductor laser. It can comprise its own power source, such as a battery or can be supplied with power through an external power connection.

The alignment device 12 emits a laser beam towards a first direction with regard to the antenna holder interface 11. In order to perform an alignment, the antenna holder 10 is used to orient the antenna holder interface 11 as well as the alignment device 12 so that the first direction points towards a specific point of the device under test 14. Now the positioning and orientation of the antenna holder interface 11 is held fixed, while the alignment device 12 along with its interface 13 is removed from the antenna holder interface 11. It is then replaced by an antenna 16 with an interface 17. This is shown in FIG. 3.

Second Embodiment

Figure 3:
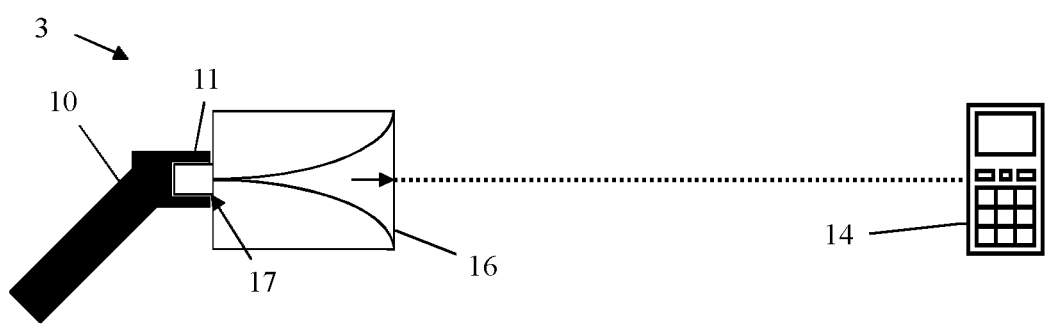
FIG. 3 shows a second embodiment of a measuring system according to the first aspect of the invention.

In FIG. 3, a second embodiment of the measuring system 3 of the first aspect of the invention is shown. Here, the antenna holder interface 11 is connected to an interface 17 of an antenna 16, especially a measuring antenna. A main radiation direction of the antenna 16 is indicated by a dashed line. The interface 17 of the antenna 16 is arranged in the antenna holder interface 11 of the antenna holder 10 so that the main radiation direction of the antenna 16 points into the first direction, the laser beam emitted by the alignment device 12 shown in FIG. 2 had pointed. Therefore, the main radiation direction of the antenna 16 points towards the exact point of the device under test 14, to which the laser beam pointed, while the alignment device 12 was connected to the antenna holder interface 11. Therefore, an alignment of the antenna 16 towards the device under test 14 has now been performed.

Third Embodiment

Figure 4:
FIG. 4 shows a third embodiment of a measuring system according to the first aspect of the invention.

In FIG. 4, an optional alignment of the opposite direction is shown. Here, the device under test 14 is additionally part of the measuring system 3. The device under test 14 additionally comprises an interface 18 for holding the interface 13 of the alignment device 12. In FIG. 4, the alignment device 12 is connected to the interface 18 of the device under test 14 by its interface 13. The alignment device 12 again emits a laser beam, which points towards a second direction with regard to the device under test 14. In order to perform an alignment of the device under test with regard to the antenna holder interface 11, the device under test 14 along with the alignment device 12 is oriented so that the laser beam points towards a specific point of the antenna holder interface 11. Now the device under test 14 is aligned with regard to the antenna holder interface 11.

It is important to note that the antenna holder interface shown in FIGS. 2-4 may be a standard interface, such as a coaxial connector, a USB connector, or any other connector. The interface 13 of the alignment device 12 as well as the interface 17 of the antenna 16 are compatible to the antenna holder interface 11.

Moreover it is important to note that the interface 18 of the device under test 14 is identical to the antenna holder interface 11, so that the alignment device 12 can be connected to the interface 18 of the device under test 14 using the same interface 13.

Fourth Embodiment

Figure 5:
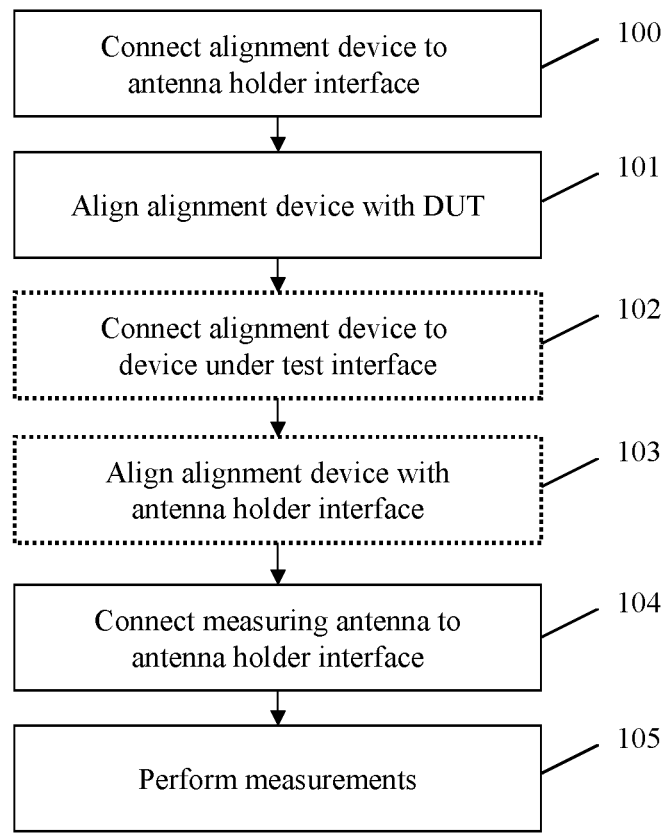
FIG. 5 shows an embodiment of the measuring method according to the second aspect of the invention.

In FIG. 5, an embodiment of the inventive measuring method according to the second aspect is shown.

In a first step 100, an alignment device is connected to an antenna holder interface.

In a second step 101, an alignment of the alignment device with a DUT is performed. This encompasses rotating and/or moving the antenna holder interface along with the alignment device, until alignment between the alignment device and the device under test has been reached.

In optional third step 102, the alignment device is now connected to an interface of the device under test.

In an optional fourth step 103, an alignment of the alignment device along with the device under test towards the antenna holder interface is performed. This encompasses orienting the device under test along with the alignment device until alignment has been reached. It is important to note that in this step the device under test should not be moved out of its position, so as not to lose the alignment from the antenna holder interface side, shown in step 101.

In a fifth step 104 a measuring antenna is connected to the antenna holder interface without changing the position and/or orientation of the antenna holder interface 11 and the device under test.

In a final sixth step 105, measurements are performed using the antenna.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to a specific construction of the antenna holder or antenna holder interface. Instead of a laser, a very narrowly focused incoherent light source can be used for the alignment device. The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

What is claimed is:

1. A measuring system for performing over the air measurements on a device under test, comprising:
   an antenna, configured for performing the over the air measurements,
   an alignment device, and
   an antenna holder interface, configured for interchangeably holding one of the antenna or the alignment device,
   wherein the alignment device is configured for aligning the antenna holder interface and the device under test.

2. The measuring system of claim 1,
   wherein the alignment device is a laser, configured for emitting a laser beam.

3. The measuring system of claim 2,
   wherein the antenna holder interface is configured so that a main radiation direction of the antenna is fixed to a first direction relative to the antenna holder interface, when the antenna holder interface holds the antenna, and
   wherein the antenna holder interface is configured to hold the alignment device so that the laser beam is emitted into said first direction.

4. The measuring system of claim 3,
   wherein the antenna comprises an interface configured to connect to the antenna holder interface, and/or
   wherein the alignment device comprises an interface configured to connect to the antenna holder interface.

5. The measuring system of claim 3,
   wherein the antenna holder interface is aligned with the device under test, when the first direction points to a specific point of the device under test.

6. The measuring system of claim 5,
   wherein the system comprises the device under test,
   wherein the device under test comprises an interface, configured for holding the alignment device.

7. The measuring system of claim 6,
   wherein the interface of the device under test is configured for holding the alignment device, so that the alignment device emits the laser beam into a second direction fixed with regard to the device under test, when the alignment device is held by the interface of the device under test.

8. The measuring system of claim 7,
   wherein the device under test is aligned with the antenna holder interface, when the second direction points to a specific point of the antenna holder interface.

9. A method for performing measurements on a device under test, comprising:
   connecting an alignment device to an antenna holder interface,
   aligning said alignment device with the device under test,
   connecting an antenna to the antenna holder interface while keeping the orientation and position of the antenna holder interface fixed, and
   performing measurements on the device under test, using the antenna.

10. The method of claim 9,
    wherein the alignment device emits a laser beam.

11. The method of claim 10,
    wherein a main radiation direction of the antenna is fixed to a first direction relative to the antenna holder interface, when the antenna holder interface holds the antenna, and
    wherein the antenna holder interface holds the alignment device so that the laser beam is emitted into said first direction.

12. The method of claim 11,
    wherein the antenna holder interface is aligned with the device under test, when the first direction points to a specific point of the device under test.

13. The method of claim 12,
    wherein an interface of the device under test can hold the alignment device so that the alignment device emits the laser beam into a second direction fixed with regard to the device under test, when the alignment device is held by the interface of the device under test.

14. The method of claim 13,
    wherein the device under test is aligned with the antenna holder interface, when the second direction points to a specific point of the antenna holder interface.

* * * * *